United States Patent [19]
Moore

[11] Patent Number: 6,133,850
[45] Date of Patent: Oct. 17, 2000

[54] METHOD AND APPARATUS FOR REDUCING CHANNEL CAPACITY REQUIRED TO REPORT A BILLABLE CONSUMPTION OF A UTILITY COMMODITY

[75] Inventor: Morris Anthony Moore, Southlake, Tex.

[73] Assignee: Motorola, Inc., Schaumburg, Ill.

[21] Appl. No.: 09/042,483

[22] Filed: Mar. 16, 1998

[51] Int. Cl.[7] .................................................. G08B 23/00
[52] U.S. Cl. .............................. 340/870.02; 340/820.05; 705/412
[58] Field of Search ................... 340/870.02, 870.05, 340/870.07; 705/412, 400; 702/61, 62, 176

[56] References Cited

U.S. PATENT DOCUMENTS 5,590,179  12/1996  Shincovich et al. .
5,696,695  12/1997  Ehlers et al. .............................. 705/412
5,842,187  11/1998  Williams ............................. 340/870.02

Primary Examiner—Michael Horabik
Assistant Examiner—Timothy Edwards, Jr.
Attorney, Agent, or Firm—R. Louis Breeden

[57] ABSTRACT

A pricing entity (124) periodically transmits (502) pricing information (226) including pricing of a utility commodity as a function of time. A meter apparatus (130) periodically make s a measurement (602) of consumption of the utility commodity during a predetermined interval, and determines (603) a time at which the measurement is made. The meter apparatus stores (604) the measurement and the time of the measurement in a memory (212), and receives and stores (504) the pricing information. The meter apparatus calculates (610) a billable cost incurred during the predetermined interval, from the measurement and the pricing of the utility commodity corresponding to the time of the measurement.

17 Claims, 3 Drawing Sheets

METHOD AND APPARATUS FOR REDUCING CHANNEL CAPACITY REQUIRED TO REPORT A BILLABLE CONSUMPTION OF A UTILITY COMMODITY

FIELD OF THE INVENTION

This invention relates in general to measurement of utility commodities, and more specifically to a method and apparatus for computing a billable consumption of a utility commodity.

BACKGROUND OF THE INVENTION

In some markets, utilities, e.g., electric power companies, are required to bill customers based on the actual cost of the utility commodity, e.g., electric power, at the time of consumption. For example, usage measurements can be required to be made every 15 minutes throughout the day, and bills are generated from the usage measurements based on the cost of power at the time.

One particular approach that has been proposed is a combination of a two-way wireless messaging unit and "smart" electric power meter that can sample power usage every 15 minutes, store the usage information, and then report the usage wirelessly once per day to a central billing entity that has knowledge of the cost of power throughout the day. In the proposed system, each usage sample requires the transmission of 10 bytes of information. A sample is required 96 times per day. Thus, 10×96×30=28800 bytes per month must be sent from each meter. In a large city, the meter reporting traffic could overwhelm the inbound channel capacity of the two-way messaging system.

Thus, what is needed is a method and apparatus for computing a billable consumption of a utility commodity. Preferably, the method and apparatus will meet the requirement for billing customers based on the actual cost of the utility commodity it the time of consumption, without generating an overwhelming amount of meter reporting traffic.

SUMMARY OF THE INVENTION

An aspect of the present invention is a method for computing a billable consumption of a utility commodity. The method comprises by a pricing entity the step of periodically transmitting pricing information comprising pricing of the utility commodity as a function of time. The method further comprises in a meter apparatus the steps of periodically making a measurement of consumption of the utility commodity during a predetermined interval, and determining a time at which the measurement is made. The method further comprises in the meter apparatus the steps of storing the measurement and the time of the measurement in a memory, and receiving and storing the pricing information. The method also includes in the meter apparatus the step of calculating a billable cost incurred during the predetermined interval, from the measurement and the pricing of the utility commodity corresponding to the time of the measurement.

Another aspect of the present invention is a meter apparatus for computing a billable consumption of a utility commodity. The meter apparatus comprises a commodity meter for periodically making a measurement of consumption of the utility commodity during a predetermined interval; and a processing system, comprising a memory, coupled to the commodity meter and coupled to a clock for storing the measurement and a time at which the measurement is made. The meter apparatus further comprises the clock for determining the time of the measurement, and a receiver coupled to the processing system for receiving and storing periodically transmitted pricing information comprising pricing of the utility commodity as a function of time. The processing system is programmed to calculate a billable cost incurred during the predetermined interval, from the measurement and the pricing of the utility commodity corresponding to the time of the measurement.

DETAILED DESCRIPTION OF THE DRAWINGS

Figure 1:
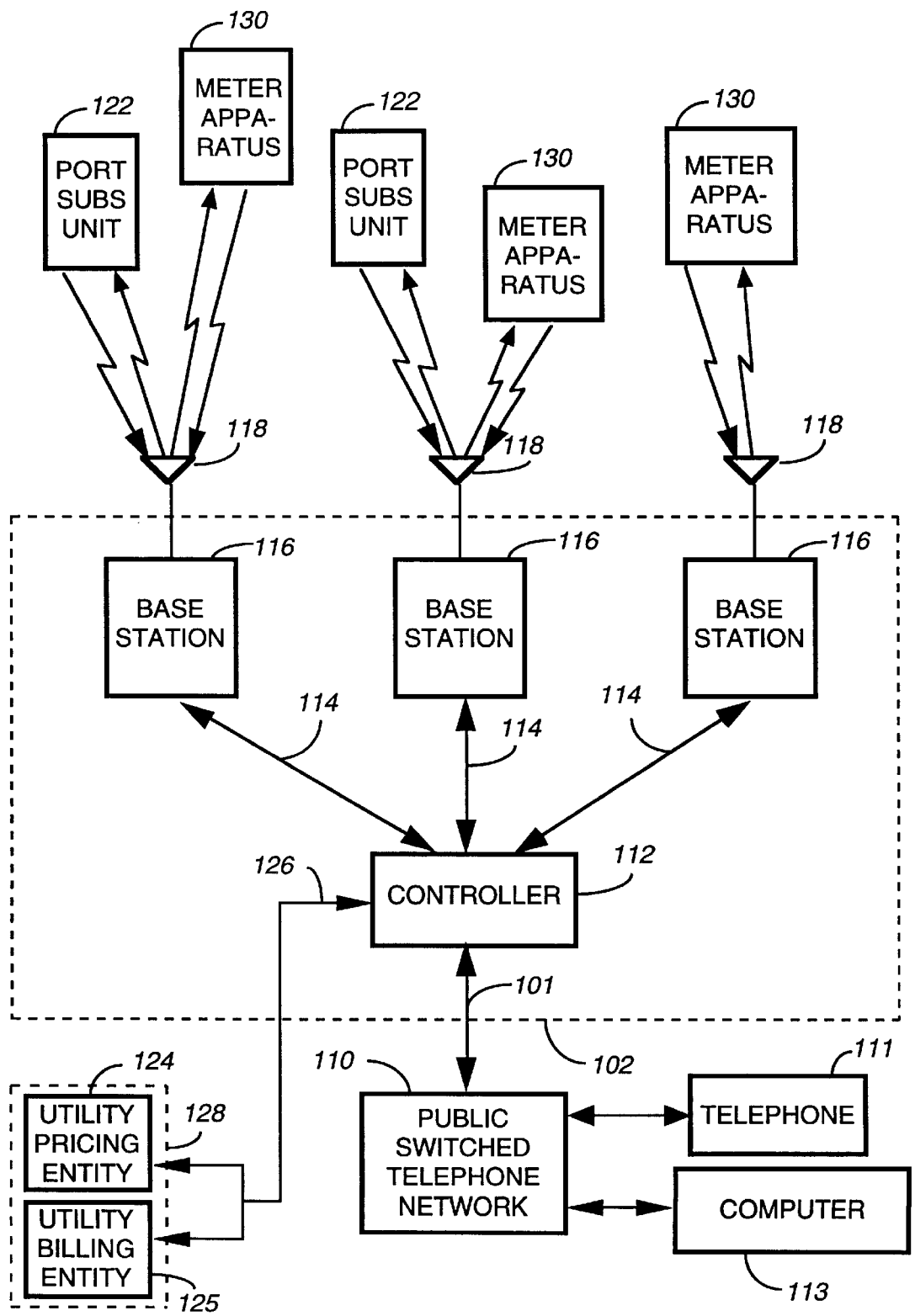
FIG. 1 is an electrical block diagram exemplary wireless messaging system in accordance with the present invention.

Referring to FIG. 1, an electrical block diagram of an exemplary wireless messaging system in accordance with the present invention comprises a fixed portion 102 including a controller 112, utility pricing and billing entities 124, 125 coupled to the controller 112 through a conventional communication link 126, and a plurality of base stations 116. The wireless messaging system also includes a plurality of portable subscriber units 122, and a plurality of meter apparatuses 130 for computing and reporting a billable consumption of a utility commodity, such as electric power. The base stations 116 preferably communicate with the portable subscriber units 122 and the meter apparatuses 130 utilizing conventional radio frequency (RF) techniques, and are coupled by communication links 114 to the controller 112, which controls the base stations 116.

The hardware of the controller 12 is preferably a combination of the Wireless Messaging Gateway (WMG™) Administrator! paging terminal, and the RF-Conductor!™ message distributor manufactured by Motorola, Inc. The hardware of the base stations 116 is preferably a combination of the RF-Orchestra! transmitter and RF-Audience!™ receivers manufactured by Motorola, Inc. The portable subscriber units 122 are preferably similar to Pagewriter™ data messaging units find Tenor™ voice messaging units, also manufactured by Motorola, Inc. It will be appreciated that other similar hardware can be utilized as well for the controller 112, the base stations 116, and the portable subscriber units 122.

Each of the base stations 116 transmits RF signals to the portable subscriber units 122 and to the meter apparatuses 130 via a transceiver antenna 118. The base stations 116 each preferably receive RF signals from the plurality of portable subscriber units 122 and from the plurality of meter apparatuses 130 via the transceiver antenna 118. The RF signals transmitted by the base stations 116 to the portable subscriber units 122 (outbound messages) comprise selective call addresses identifying the portable subscriber units 122, and voice and data messages originated by callers, is well as commands originated by the controller 112 for adjusting operating parameters of the radio communication system. In addition, the utility pricing entity 124 periodically transmits outbound messages through the wireless messaging system containing pricing information addressed to the meter apparatuses 130 through well-known techniques for message entry. The RF signals transmitted by the portable subscriber units 122 to the base stations 116 (inbound messages) comprise responses that include scheduled messages, such as positive acknowledgments (ACKs) and negative acknowledgments (NAKs), and unscheduled messages, such as registration requests. The RF signals transmitted by the meter apparatuses 130 to the base stations 116, and thence to the utility billing entity 125, comprise accumulated cost records in accordance with the present invention, as will be described further below.

The controller 112 preferably is coupled by telephone links 101 to a public switched telephone network (PSTN) 110 for receiving selective call message originations therefrom. Selective call originations comprising voice and data messages from the PSTN 110 can be generated, for example, from a conventional telephone 111 or a conventional computer 113 coupled to the PSTN 110. It will be appreciated that, alternatively, other types of communication networks, e.g., packet switched networks and local area networks, can be utilized as well for transporting originated messages to the controller 112. It will be further appreciated that, alternatively, the wireless messaging system can be dedicated to exclusively serving the utility pricing and billing entities 124, 125 by eliminating the portable subscriber units 122 and the telephone links 101. It will also be appreciated that, alternatively, the utility pricing and billing entities 124, 125 can be combined into a single utility pricing and billing entity 128, as well.

The over-the-air protocol utilized for outbound and inbound messages is preferably selected from Motorola's well-known FLEX™ family of digital selective call signaling protocols. These protocols utilize well-known error detection and error correction techniques and are therefore tolerant to bit errors occurring during transmission, provided that the bit errors are not too numerous in any one code word. It will be appreciated that other suitable protocols can be used as well.

Figure 2:
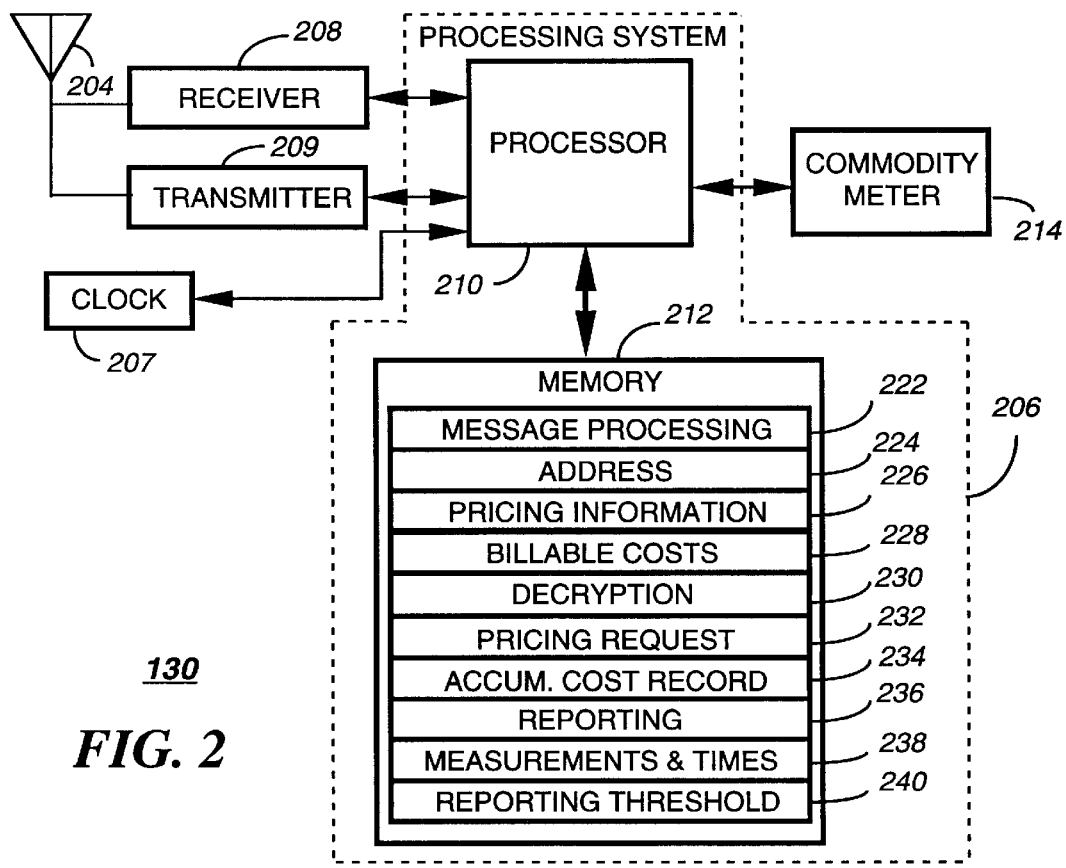
FIG. 2 is an electrical block diagram of an exemplary meter apparatus in accordance with the present invention.

FIG. 2 is an electrical block diagram of an exemplary meter apparatus 130 in accordance with the present invention. The meter apparatus 130 comprises an antenna 204 for intercepting an outbound message and for transmitting an inbound message. The antenna 204 is coupled to a conventional receiver 208 for receiving the outbound message and is also preferably coupled to a conventional transmitter 209 for transmitting the inbound message. The receiver 208 and the transmitter 209 are coupled to a processing system 206 for processing the outbound and inbound messages and for controlling the meter apparatus 130 in accordance with the present invention. A commodity meter 214 is also coupled to the processing system 206 for measuring commodity consumption. The commodity meter 214 preferably is similar to a conventional electric power meter in combination with a Sentry 5 Automatic Meter Reader, manufactured by Design Concepts International of Boise, Id., and modified through well-known techniques to interface with the processing system 206. It will be appreciated that alternatively, other similar automatic meter readers can be used as well to construct the commodity meter 214. A conventional clock 207 is also coupled to the processing system 206 for supporting time keeping requirements in accordance with the present invention.

The processing system 206 comprises a conventional processor 210 and a conventional memory 212. The memory 212 comprises software elements and databases for programming the processing system 206 in accordance with the present invention. The memory 212 further comprises a message processing element 222 for processing a message in accordance with the present invention. The memory 212 also includes an address element 224 for storing selective call addresses to which the meter apparatus 130 is responsive. In addition, the memory 212 includes pricing information 226 received periodically from the utility pricing entity 124. The memory 212 also includes a billable costs element 228 for programming the processing system 206 to calculate and store billable costs in accord once with the present invention. The memory 212 further comprises a decryption element 230 for decrypting the pricing information 226 when it is transmitted in an encrypted format by the utility pricing entity 124. In addition, the memory 212 includes a pricing request element 232 for requesting the pricing information 226 from the utility pricing entity 124 when the meter apparatus 130 has not received the current pricing information 226. In addition, the memory 212 further comprises an accumulated cost record 234, which is transmitted to the utility billing entity 125 when the meter apparatus 130 reaches a reporting threshold. The memory 212 also includes a reporting element 236 for programming the processing system 206 to report the accumulated cost record 234 via the inbound channel of the wireless messaging system. In addition, the memory 212 includes space for measurements and times 238 stored by the processing system 206 for later conversion to billable costs in accordance with the present invention. The memory 212 further comprises a reporting threshold 240 which determines when the meter apparatus will report its billable consumption to the billing entity 125.

Figure 3:
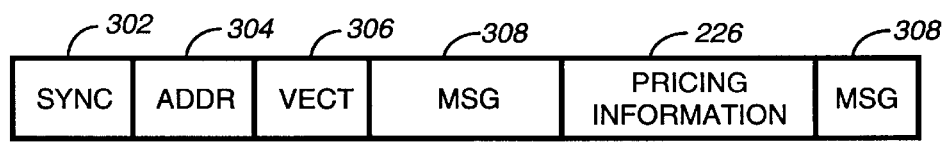
FIG. 3 is a protocol structure diagram depicting an exemplary outbound transmission format in accordance with the present invention.

FIG. 3 is a protocol structure diagram 300 depicting an exemplary outbound transmission format in accordance with the present invention. The diagram 300 includes a synchronization portion 302 for synchronizing the meter apparatus 130 with transmissions of the base stations 116, using well-known techniques. The diagram 300 further includes an address field 304 for indict ting the meter apparatus(es) 122 and/or portable subscriber unit(s) 122 for which the transmission is intended. In addition, the diagram 300 includes a vector field 306 for pointing to messages 308 and to the pricing information 226 intended, respectively, for portable subscriber units 122 and for meter apparatuses 130. The pricing information 226 preferably includes pricing of the utility commodity as a function of time. For example, the pricing of electric power may be required to be specified in fifteen-minute intervals, based upon the cost of power to the utility company. The pricing information 226 preferably is determined from the actual cost of the commodity at the time of consumption and is transmitted to the meter apparatuses 130 after consumption for computing the billable cost. It will be appreciated that, alternatively, the pricing information can be predicted and transmitted to the meter apparatus before consumption. The latter alternative can reduce memory requirements in the mete apparatus for storing consumption measurements and times, but is less accurate.

Figure 4:
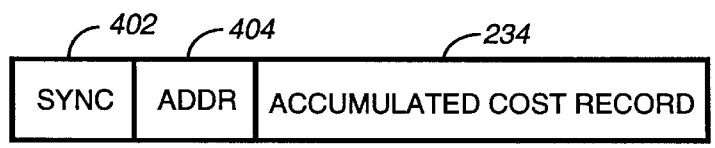
FIG. 4 is a protocol structure diagram depicting an exemplary inbound transmission format in accordance with the present invention.

FIG. 4 is a protocol structure diagram 400 depicting an exemplary inbound transmission format in accordance with the present invention. The diagram 400 comprises a synchronization portion 402 for synchronizing receivers of the base station 116 with transmissions of the meter apparatuses 130, using well-known techniques. The diagram 400 further comprises an address portion 404 for identifying the metering apparatus sending the inbound message. The diagram also includes the accumulated cost record 234, which comprises a sum of the billable costs measured by the meter apparatus 130 since its last transmission.

Figure 5:
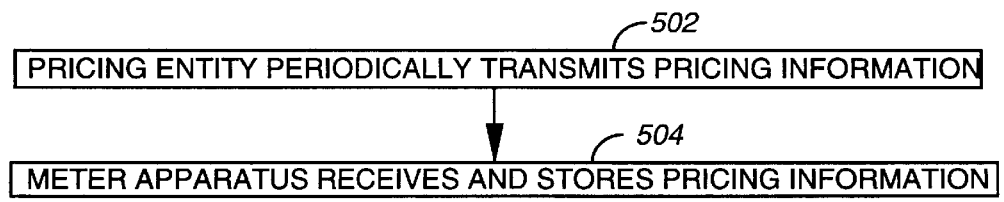
FIG. 5 is a flow chart depicting an exemplary operation of the wireless messaging system in accordance with the present invention.

FIG. 5 is a flow chart 500 depicting am exemplary operation of the wireless messaging system in accordance with the present invention. The flow begins with the utility pricing entity 124 periodically transmitting 502 the pricing information 226 as an outbound message through the wireless messaging system. The outbound message can be addressed to a single meter apparatus 130, if necessary. Preferably, however, the pricing information is broadcast as a group call message, so that many meter apparatuses 130 will receive the pricing information at once in a single transmission. Also preferably, the utility pricing entity 124 encrypts the pricing information 226 before transmission. Alternatively or additionally, the utility pricing entity 124 can apply a multiplier or an offset, or both, to the pricing information 226 to make it more difficult for an eavesdropper to decipher. The meter apparatus 130 then receives 504 the pricing information 226 and stores it in the memory 212.

Figure 6:
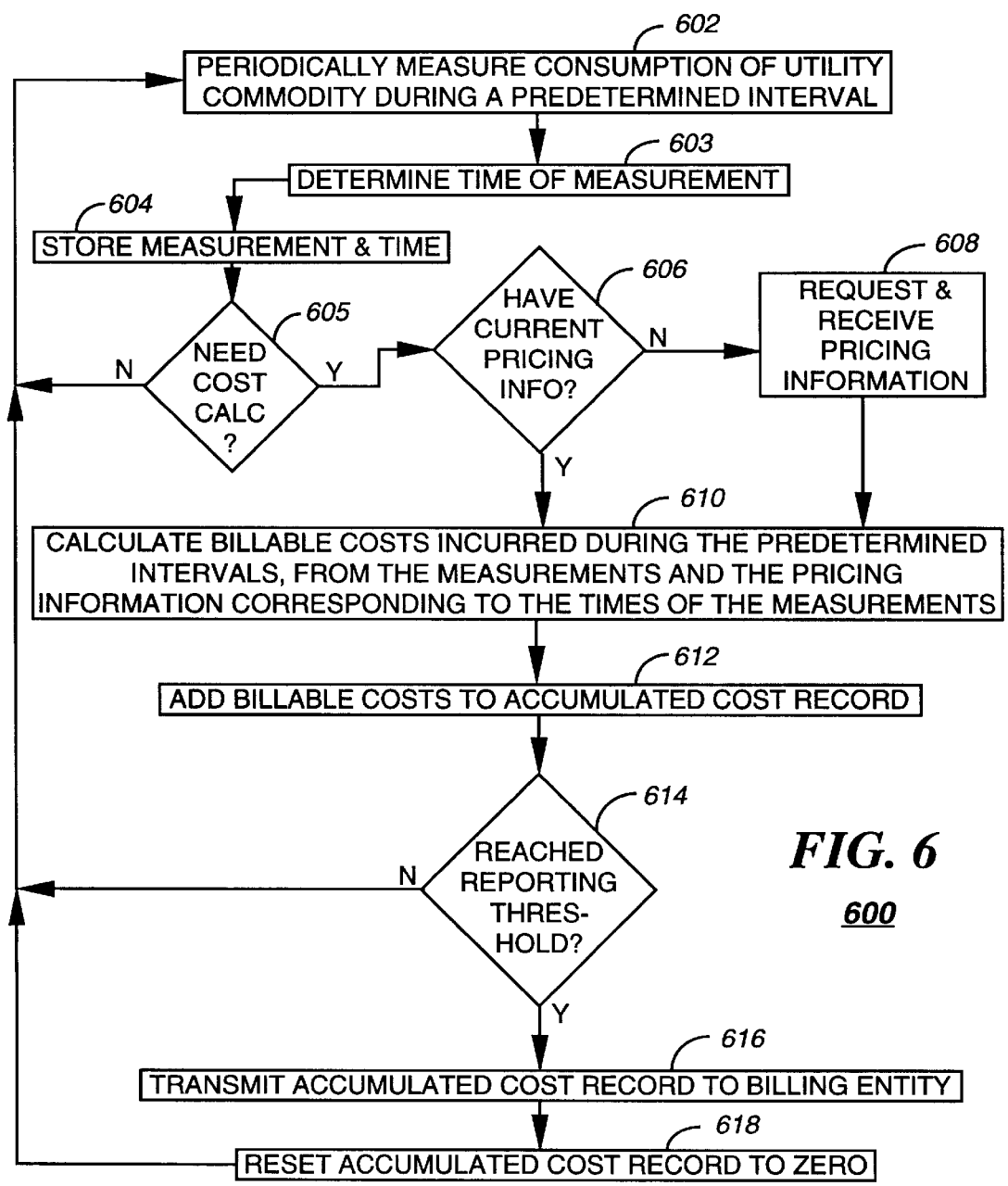
FIG. 6 is a flow chart depicting an exemplary operation of the meter apparatus in accordance with the present invention.

FIG. 6 is a flow chart 600 depicting an exemplary operation of the meter apparatus 130 in accordance with the present invention. The flow begins with the processing system 206 periodically, e.g., every fifteen minutes, measuring 602 the consumption of the utility commodity, e.g., electric power, during a predetermined interval, e.g., the next fifteen minutes. The processing system 206 checks the clock 207 to determine 603 the time of the measurement. The processing system 206 then stores 604 the consumption measurement and the time (including the date) of the measurement in the memory 212. The processing system next checks 605 whether a cost calculation is needed The cost calculation preferably is required just after the current pricing information 226 has been received. Alternatively, the cost calculation can be required, for example, at a particular time of day, or (for systems which predict the pricing prior to consumption) immediately after each consumption measurement.

If at step 605 no cost calculation is needed, the flow returns to step 602 to continue measuring consumption during a next predetermined interval. If, on the other hand, the cost calculation is needed, the processing system 206 compares the time of the measurement with a predetermined one of the times, e.g., the latest one, stored in the pricing information 226 to determine 606 whether the pricing information stored therein is current. If not, the processing system 206 accesses the pricing request element 232 and controls the transmitter 209 and the receiver 208 to request and receive 608 the current pricing information 226 through the wireless messaging system.

In any event, the processing system 206 then calculates 610 the billable costs incurred during the predetermined intervals, from the consumption measurements and the pricing of the utility commodity corresponding to the times of the measurements. The processing system 206 then adds 612 the billable costs to the accumulated cost record 234. The processing system 206 then checks 614 whether the reporting threshold 240 has been reached. The reporting threshold 240 preferably represents a time and date corresponding to the end of a cost accumulation cycle, e.g., the end of the month, a time of day, or the end of a billing cycle applicable to the meter apparatus 130. It will be appreciated that, alternatively, the reporting threshold 240 can represent a predetermined limit of accumulated cost, e.g., $100.00 worth of accumulated cost.

If in step 614 the reporting threshold has not been reached, the flow returns to step 602 to measure the next interval of consumption. If, on the other hand, the reporting threshold has been reached, the processing system 206 controls the transmitter 209 to transmit 616 the accumulated cost record 234 over the inbound channel of the two-way wireless messaging system. After receiving an acknowledgment from the wireless messaging system that the accumulated cost record 234 has been received without errors, the processing system 206 then resets 618 the accumulated cost record 234 to zero and then returns to step 602.

The advantages of operation in accordance with the present invention can be demonstrated through some examples. For these examples it is assumed that ten byte, are required to send each consumption sample using prior art techniques. We also will assume that ten bytes are required to send the cost information for each time interval in a message broadcast as an outbound group call to all meter apparatuses in accordance with the present invention. In addition we will assume that ten bytes are required per meter apparatus to report the accumulated cost record. For both examples, it is assumed that consumption of the utility commodity is required to be measured in fifteen minute intervals.

Example prior art technique (meter reports power consumption every fifteen minutes):

10 bytes/sample×96 samples/day×30 days/month=28800 bytes/month inbound per meter.

Example technique according to the present invention (meter apparatus reports accumulated cost record once per month):

10 bytes/sample×96 samples/day×30 days/month=28800 bytes/month outbound one time for entire market area. (It will be appreciated that the outbound pricing information may have to be sent more than one time to achieve the desired transmission reliability.)

10 bytes/month inbound per meter apparatus 130.

As the number of meter apparatuses 130 is expected to be relatively large, the technique in accordance with the present invention advantageously represents about a 3000× improvement over the prior art technique, and renders capacity a virtual non-issue. Even if the reporting of the accumulated cost record is required once per day instead of once per month as in the above example, the improvement is about 100× over the prior art technique.

Thus, it should be clear from the preceding disclosure that the present invention advantageously provides a method and apparatus for computing a billable consumption of a utility commodity. Advantageously, the method and apparatus meets the requirement for billing customers based on the actual cost of the utility commodity at the time of consumption, without generating an overwhelming amount of meter reporting traffic.

Many modifications and variations of the present invention are possible in light of the above teachings. For example, billable consumption of other types of utilities, such as gas and water, can be efficiently reported in accordance with the present invention. Thus, it is to be understood that, within the scope of the appended claims, the invention can be practiced other than as described herein above.

What is claimed is:

1. A method for reducing channel capacity required to report a billable consumption of a utility commodity, the method comprising by a pricing entity the step of periodically transmitting pricing information comprising pricing of the utility commodity as a function of time; and the method further comprising in a meter apparatus the steps of:

periodically making a measurement of consumption of the utility commodity during a predetermined interval;

determining a time at which the measurement is made;

storing the measurement and the time of the measurement in a memory;

receiving and storing the pricing information;

calculating a billable cost incurred during the predetermined interval, from the measurement and the pricing of the utility commodity corresponding to the time of the measurement;

adding the billable cost to an accumulated cost record stored in the meter apparatus; and subsequently transmitting the accumulated cost record to a billing entity, in response to reaching a reporting threshold, such that customer billing based upon the cost of the utility commodity at the time of consumption is enabled without having to report each usage sample.

2. The method of claim 1, further comprising in the meter apparatus the step of requesting the pricing information from the pricing entity when the meter apparatus has not received current pricing information.

3. The method of claim 1, wherein the step of periodically transmitting the pricing information comprises the step of encrypting the pricing information.

4. The method of claim 1, wherein the step of periodically transmitting the pricing information comprises the step of applying at least one of a multiplier and an offset to the pricing information.

5. The method of claim 1, wherein the step of subsequently transmitting the accumulated cost record comprises the step of transmitting the accumulated cost record over an inbound channel of a two-way wireless messaging system.

6. The method of claim 1, wherein the step of subsequently transmitting the accumulated cost record comprises the step of transmitting the accumulated cost record in response to reaching an end of a cost accumulation cycle.

7. The method of claim 1, wherein the step of subsequently transmitting the accumulated cost record comprises the step of transmitting the accumulated cost record in response to reaching a predetermined limit of accumulated cost.

8. The method of claim 1, where in the step of periodically transmitting the pricing information comprises the step of broadcasting the pricing formation as a message in a wireless messaging system.

9. The method of claim 8, wherein the broadcasting step comprises the step of broadcasting the pricing information as a group call message.

10. A meter apparatus for reducing channel capacity required to report a billable consumption of a utility commodity, the meter apparatus comprising:

a commodity meter for periodically making a measurement of consumption of the utility commodity during a predetermined interval;

a processing system, comprising a memory, coupled to the commodity meter and coupled to a clock for storing the measurement and a time at which the measurement is made;

the clock for determining the time of the measurement;

a receiver coupled to the processing system for receiving and storing periodically transmitted pricing information comprising pricing of the utility commodity as a function of time; and a transmitter coupled to the processing system for transmitting information to a billing entity, wherein the processing system is programmed to:

calculate a billable cost incurred during the predetermined interval, from the measurement and the pricing of the utility commodity corresponding to the time of the measurement;

add the billable cost to an accumulated cost record stored in the memory; and subsequently control the transmitter to transmit the accumulated cost record to the billing entity, in response to reaching a reporting threshold, such that customer billing based upon the cost of the utility commodity at the time of consumption is enabled without having to report each usage sample.

11. The meter apparatus of claim 10, wherein the processing system is further programmed to decrypt the pricing information.

12. The meter apparatus of claim 10, wherein the processing system is further programmed to control the transmitter to request the pricing information from a pricing entity when the meter apparatus has no received current pricing information.

13. The meter apparatus of claim 10, wherein the processing system is further programmed to control the transmitter to transmit the accumulated cost record over an inbound channel of a two-way wireless messaging system.

14. The meter apparatus of claim 10, wherein the processing system is further programmed to control the transmitter to transmit the accumulated cost record in response to reaching an end of a cost accumulation cycle.

15. The meter apparatus of claim 10, wherein the processing system is further programmed to control the transmitter to transmit the accumulated cost record in response to reaching a predetermined limit of accumulated cost.

16. The meter apparatus of claim 10, wherein the processing system is further programmed to decode the pricing information from a message in a wireless messaging system.

17. The meter apparatus of claim 16, wherein the processing system is further programmed to decode the pricing information from a group call message.

* * * * *